United States Patent
Lee

(10) Patent No.: US 8,394,234 B2
(45) Date of Patent: *Mar. 12, 2013

(54) SPIN HEAD AND METHOD OF CHUCKING SUBSTRATE USING THE SAME

(75) Inventor: Taek Youb Lee, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 418 days.

This patent is subject to a terminal disclaimer.

(21) Appl. No.: 12/591,247

(22) Filed: Nov. 13, 2009

(65) Prior Publication Data

US 2010/0126962 A1    May 27, 2010

(30) Foreign Application Priority Data

Nov. 26, 2008    (KR) .................. 10-2008-0118072

(51) Int. Cl.
*H01L 21/465* (2006.01)
(52) U.S. Cl. ............... 156/345.55; 156/345.23; 134/157
(58) Field of Classification Search ............. 156/345.55, 156/345.23; 134/157
See application file for complete search history.

(56) References Cited

U.S. PATENT DOCUMENTS

| | | | |
|---|---|---|---|
| 4,788,994 | A | 12/1988 | Shinbara |
| 4,898,639 | A | 2/1990 | Moe et al. |
| 6,964,419 | B2 | 11/2005 | Jan |
| 7,354,481 | B2 | 4/2008 | Okuno et al. |
| 2004/0031503 | A1 | 2/2004 | Eitoku |
| 2006/0023723 | A1 | 2/2006 | Morara |
| 2006/0054082 | A1 | 3/2006 | Okuno et al. |
| 2007/0065267 | A1 | 3/2007 | Gueler |
| 2008/0052948 | A1 | 3/2008 | Kim et al. |
| 2008/0061519 | A1 | 3/2008 | Cho et al. |
| 2008/0127888 | A1 | 6/2008 | Kim et al. |
| 2009/0090467 | A1* | 4/2009 | Lee .................. 156/345.23 |
| 2009/0093123 | A1* | 4/2009 | Lee et al. .............. 438/706 |
| 2010/0126539 | A1* | 5/2010 | Lee et al. .............. 134/157 |
| 2010/0126962 | A1 | 5/2010 | Lee |
| 2010/0130020 | A1* | 5/2010 | Kim et al. .............. 438/745 |

FOREIGN PATENT DOCUMENTS

| | | |
|---|---|---|
| JP | 06-037003 | 2/1994 |
| JP | 07-094573 | 4/1995 |
| JP | 08-290095 | 11/1996 |
| JP | 09-097780 | 4/1997 |
| JP | 09-107023 | 4/1997 |
| JP | 10-050645 | 2/1998 |
| JP | 10-199964 | 7/1998 |
| JP | 11-040655 | 2/1999 |
| JP | 11-163094 | 6/1999 |
| JP | 2000-208591 | 7/2000 |

(Continued)

OTHER PUBLICATIONS

Machine Generated English translation of JP 2001-070894.

(Continued)

*Primary Examiner* — Sylvia R. MacArthur
(74) *Attorney, Agent, or Firm* — Harness, Dickey & Pierce, P.L.C.

(57) ABSTRACT

Provided is a spin head. Chuck pins, installed at a support plate to support the lateral surface of a substrate, are moved along the perpendicular direction to the radial direction of the support plate. The effect of centrifugal force applied to the chuck pins during the rotation of the support plate is minimized to support a substrate stably.

20 Claims, 13 Drawing Sheets

FOREIGN PATENT DOCUMENTS

| | | |
|---|---|---|
| JP | 2000-332085 | 11/2000 |
| JP | 2001-044159 | 2/2001 |
| JP | 2001-070894 | 3/2001 |
| JP | 2003-085988 | 3/2003 |
| JP | 2003-086566 | 3/2003 |
| JP | 2003-229399 | 8/2003 |
| JP | 2004-079740 | 3/2004 |
| JP | 2006-190448 | 7/2006 |
| JP | 2007-141449 | 6/2007 |
| KR | 10-2000-0062849 | 10/2000 |
| KR | 20-0264564 | 2/2002 |
| KR | 10-2006-0059055 | 6/2006 |
| KR | 10-2007-0011308 | 1/2007 |
| KR | 10-0746576 | 7/2007 |
| KR | 10-2008-0020036 | 3/2008 |

OTHER PUBLICATIONS

Machine Generated English translation of JP 2003-229399.
US Office Action dated Apr. 27, 2011 for Co-pending U.S. Appl. No. 12/222,148.
US Office Action dated Jul. 20, 2011 for Co-pending U.S. Appl. No. 12/222,149.
US Office Action dated Oct. 26, 2011 for Co-pending U.S. Appl. No. 12/222,148.
US Office Action dated Dec. 19, 2011 for Co-pending U.S. Appl. No. 12/222,149.
US Office Action dated Apr. 12, 2012 for Co-pending U.S. Appl. No. 12/222,148.
Notice of Allowance dated Apr. 25, 2012 for Co-pending U.S. Appl. No. 12/222,149.
Notice of Allowance dated Jun. 15, 2012 for Co-pending U.S. Appl. No. 12/222,148.

* cited by examiner

SPIN HEAD AND METHOD OF CHUCKING SUBSTRATE USING THE SAME

CROSS-REFERENCE TO RELATED APPLICATIONS

This U.S. non-provisional patent application claims priority under 35 U.S.C. §119 of Korean Patent Application No. 10-2008-0118072, filed on Nov. 26, 2008, the entire contents of which are hereby incorporated by reference.

BACKGROUND OF THE INVENTION

The present invention disclosed herein relates to a substrate processing apparatus, and more particularly, to a rotatable spin head supporting a substrate in a semiconductor process.

In general, a semiconductor device is fabricated by depositing various materials in a thin layer on a substrate and patterning the thin layer. To this end, various processes including a depositing process, a photo process, an etch process, and a cleaning process are required.

Of these, the etch process is a process of removing a layer from a substrate, and the cleaning process is a process of removing contaminants from a surface of a substrate after unit processes of fabricating a semiconductor device. Etch processes and cleaning processes are classified into wet-type processes and dry-type processes according to process types, and the wet-type processes are classified into batch-type processes and spin-type processes.

In the spin-type process, pin members supporting a substrate are installed on the upper surface of a spin head, and the spin head is rotated to rotate the substrate supported by the pin members. Chemical solution (etch solution or cleaning solution) is supplied to the upper or lower surface of the substrate through a front side nozzle provided to the upper side of the substrate and a back side nozzle provided to the spin head, and the substrate is processed therethrough.

SUMMARY OF THE INVENTION

The present invention provides a spin head having a simple structure, which stably supports a substrate.

The present invention also provides a spin head configured to bring all of chuck pins in contact with a substrate.

The present invention also provides a spin head configured to bring chuck pins in stable contact with the lateral portion of a substrate at a high speed.

Embodiments of the present invention provide spin heads including: a support plate; chuck pins installed at the support plate to support a lateral surface of a substrate; and a chuck pin moving unit configured to move the chuck pins along a second direction perpendicular to a first direction toward periphery from a center of the support plate.

In some embodiments, the support plate may have a circular shape, and the first direction may be a radial direction of the support plate.

In other embodiments, the chuck pin moving unit may include: moving rods, disposed to have a lengthwise direction along the second direction, first ends of the moving rods being coupled with the chuck pins; and a driving member moving the moving rods in a straight line along the second direction to move the chuck pins between supporting positions and waiting positions.

In still other embodiments, the driving member may include: guides coupled to second ends respectively of the moving rods and having guide holes; and a rotatable rotation plate having a ring shape and provided with driving rods inserted into the guide holes of the guides.

In even other embodiments, the driving member may further include a restorer, wherein the restorer returns the rotation plate rotated to an initial position when the rotation plate is rotated such that the driving rods apply contact load to the guide holes to move the chuck pins to the waiting positions, and the restorer includes an elastic member that has a first end coupled to the rotation plate and a second end coupled to the support plate to generate restoring force through elasticity.

In yet other embodiments, the rotation plate may be provided with a first latch to which the first end of the elastic member is fixed, the support plate may be provided with a second latch to which the second end of the elastic member is fixed, the second latch may be spaced apart from the first latch along a circumferential direction of the support plate, and the elastic member may be maintained in extended state when the chuck pins are disposed at the waiting positions.

In further embodiments, the driving member may further include a roller rotatably coupled to the driving rod and contacting an inner surface of the guide hole, and the roller may be formed of metal.

In still further embodiments, the guide hole may have a slot shape with a length greater than an outer diameter of the roller such that the roller contacting a first end of the guide hole moves along the guide hole, and then, contacts a second end of the guide hole when the chuck pin moves between the supporting position and the waiting position.

In even further embodiments, the rotation plate may be provided with a plurality of protrusions protruding from a circumferential surface of the rotation plate along a radial direction, the number of the protrusions may correspond to the number of the driving rods, and the driving rods may be installed at the protrusions, respectively.

In yet further embodiments, the driving member may further include a restorer, wherein the restorer returns the rotation plate rotated to an initial position when the rotation plate is rotated such that the driving rods apply contact load to the guide holes to move the chuck pins to the waiting position, the restorer may include an elastic member that has a first end coupled to the protrusion and a second end coupled to the support plate to generate restoring force through elasticity, the protrusion is provided with a first latch to which the first end of the elastic member is fixed, the support plate is provided with a second latch to which the second end of the elastic member is fixed, the second latch is spaced apart from the first latch along a circumferential direction of the support plate, and the elastic members are maintained in extended state when the chuck pins are disposed at the waiting positions.

In much further embodiments, the driving member may further include stoppers that are provided to the support plate to limit rotation ranges of the protrusions provided to the rotation plate when the rotation plate is restored by the elastic members.

In still much further embodiments, the first end of each of the elastic members may be coupled to one of neighboring ones of the protrusions, and the stoppers may be provided to the support plate to limit the rotation ranges of the protrusions not coupled with the elastic member.

In even much further embodiments, the chuck pin moving unit may further include contact maintaining members, wherein the contact maintaining member rotates the rotation plate to maintain contact of the driving rod with the guide hole while the chuck pin is disposed at the supporting position, and the contact maintaining member is movable to a position allowing rotation of the rotation plate while the chuck pin moves from the supporting position to the waiting position.

In yet much further embodiments, the contact maintaining member may have a shape configured to rotate the rotation plate by reverse centrifugal force when the support plate is rotated.

In yet much further embodiments, the contact maintaining member may include: a first protrusion protruding from a circumferential surface of the rotation plate; and a maintaining bar installed at the support plate and rotated by the reverse centrifugal force to contact the first protrusion, wherein the maintaining bar includes: a middle portion coupled to the support plate to be rotatable about the support plate; a pressing portion extending from the middle portion to the rotation plate and pushing the first protrusion; and a guide portion extending in a direction toward periphery of the support plate from the middle portion.

In yet much further embodiments, the guide portion may be heavier than the pressing portion, and an angle between the guide portion and the pressing portion may be an obtuse angle.

In yet much further embodiments, the rotation plate may be provided with a plurality of second protrusions that protrude along a radial direction of the rotation plate, the number of the second protrusions may correspond to the number of the driving rods, the driving rods may be respectively installed at the second protrusions, and the driving member may further include stoppers provided to the support plate to limit rotation ranges of the first protrusions and the second protrusions.

In yet much further embodiments, the chuck pin moving unit may further include a distance adjusting member adjusting the supporting positions of the chuck pins, the distance adjusting member may include a transporting shaft that is axially aligned with the moving rod along the longitudinal direction of the moving rod, the transporting shaft may have an end rotatably coupled to the second end of the moving rod, and a circumferential surface provided with a thread, and the guide may include: a first body screw-coupled to the transporting shaft; and a second body connected to the first body and removably coupled to the moving rod to prevent the first body from rotating relative to the moving rod.

In yet much further embodiments, the distance adjusting member may further include a fixer disposed on an opposite side of the transporting shaft to the moving rod with respect to the first body and screw-coupled to the transporting shaft.

In yet much further embodiments, the chuck pin moving unit may further include a guide member installed at the support plate and guiding the moving rod moving along the second direction.

In still other embodiments of the present invention, methods of chucking a substrate include: moving chuck pins, supporting a lateral surface of the substrate, between supporting positions and waiting positions along a second direction different from a first direction toward periphery from a center of the support plate.

In some embodiments, when the chuck pins are disposed at the supporting positions, the chuck pins may be moved along the second direction to be positioned at the same distance from the center of the support plate.

In other embodiments, the support plate may have a circular shape, and the first direction may be a radial direction of the support plate. The second direction may be perpendicular to the first direction.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
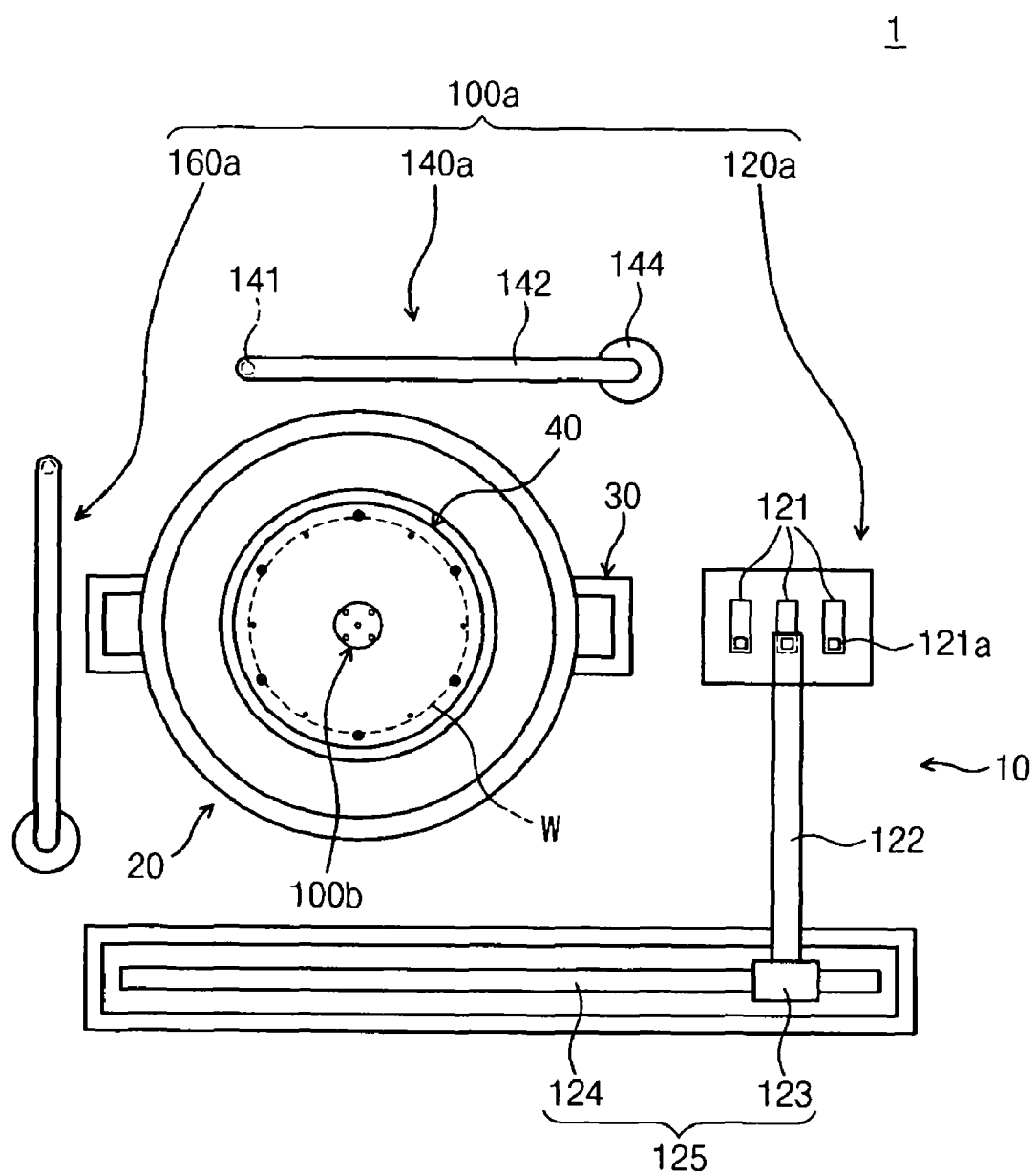
FIG. 1 is a plan view illustrating a substrate processing apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout. Moreover, detailed descriptions related to well-known functions or configurations will be ruled out in order not to unnecessarily obscure subject matters of the present invention.

Embodiment

An apparatus, cleaning a substrate W with chemical solution, rinse solution, and dry gas, will now be described according to an embodiment of present invention. However, the spirit and scope of the present invention is not limited thereto, and thus, a spin head according to an embodiment of the present invention may be applied to various devices rotating the substrate W to perform a process, such as an etch process.

FIG. 1 is a plan view illustrating a substrate processing apparatus 1 according to the current embodiment. Referring to FIG. 1, the substrate processing apparatus 1 includes a fluid supplying unit 10, a container 20, an elevating unit 30, and a spin head 40. The fluid supplying unit 10 supplies process solution or gas for processing a substrate to the substrate W. The spin head 40 supports and rotates the substrate W during a process. The container 20 prevents process solution used in the process and fume generated in the process from being splashed or discharged to the outside. The elevating unit 30 moves the container 20 up and down and varies a relative height between the container 20 and the spin head 40.

The fluid supplying unit 10 includes an upper nozzle member 100a and a lower nozzle member 100b. The substrate W is spaced a predetermined distance from the upper surface of the spin head 40. The upper nozzle member 100a supplies process solution or gas to the upper surface of the substrate W placed on the spin head 40. The lower nozzle member 100b supplies process solution or gas to the lower surface of the substrate W placed on the spin head 40. The lower nozzle member 100b may supply process solution or gas between the spin head 40 and the substrate W.

The upper nozzle member 100a includes a chemical solution supplying nozzle 120a, a rinse solution supplying nozzle 140a, and a dry gas supplying nozzle 160a. The chemical solution supplying nozzle 120a supplies a plurality of types of chemical solution to the substrate W. The chemical solution supplying nozzle 120a includes a plurality of injectors 121, a support bar 122, and a bar moving device 125. The injectors 121 are disposed on a side of the container 20. The injectors 121 are respectively connected to chemical solution storages (not shown) to receive chemical solution from the chemical solution storages that store different types of solution from each other. The injectors 121 are parallel to each other in a predetermined direction. Each of the injectors 121 includes a protrusion 121a protruding upward. A side surface of the protrusion 121a may be provided with a recess (not shown). Chemical solution may be one of sulfuric acid, nitric acid, ammonia, fluoric acid, and a mixture thereof with deionized water. An end of each of the injectors 121 is provided with a discharging hole.

The support bar 122 is coupled to one of the injectors 121 to move the injector 121 to the upper portion of the substrate W placed on the spin head 40. The support bar 122 has a long rod shape. The longitudinal direction of the support bar 122 is perpendicular to a direction in which the injectors 121 are arrayed. The lower surface of the support bar 122 is provided with a holder (not shown) for coupling to the injector 121. The holder includes arms (not shown) that are insertable into the recess disposed in the protrusion 121a of the injector 121. The arms may be rotatable or movable from the outside of the protrusion 121a to the recess of the protrusion 121a.

The bar moving device 125 moves the support bar 122 in a straight line between an upper position of the substrate W placed on the spin head 40 and upper positions of the injectors 121. The bar moving device 125 includes a bracket 123, a guide rail 124, and a driver (not shown). The guide rail 124 is disposed on another side of the container 20, and extends in a straight line parallel with the array of the injectors 121. The bracket 123 is coupled to the guide rail 124 to move along the guide rail 124. The support bar 122 is fixed to the bracket 123. The driver provides driving force that moves the bracket 123 in a straight line. An assembly including a motor and a screw may move the bracket 123 in a straight line. Alternatively, an assembly including a belt, a pulley, and a motor may move the bracket 123 in a straight line. Alternatively, a linear motor may move the bracket 123 in a straight line.

The rinse solution supplying nozzle 140a is disposed on another side of the container 20, and the dry gas supplying nozzle 160a is disposed on another side of the container 20.

The rinse solution supplying nozzle 140a includes an injector 141, a support bar 142, and a driver 144. The injector 141 is fixed to an end of the support bar 142. A rotation shaft (not shown) rotated by the driver 144 is fixed to the other end of the support bar 142. The injector 141 receives rinse solution from a rinse solution storage (not shown). The dry gas supplying nozzle 160a approximately has the similar structure to that of the rinse solution supplying nozzle 140a. The dry gas supplying nozzle 160a supplies isopropyl alcohol and nitrogen gas that may be heated.

Figure 4:
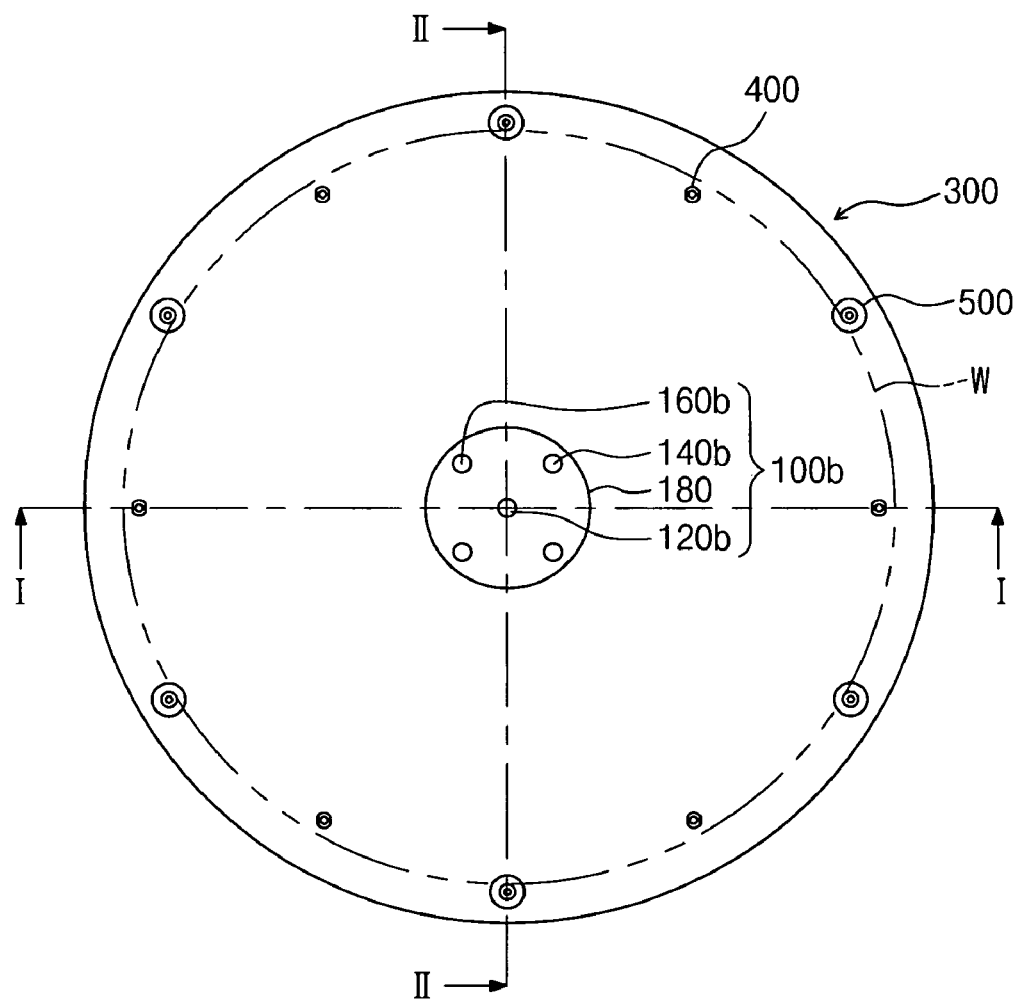
FIG. 4 is a plan view illustrating a spin head according to an embodiment of the present invention.
Figure 5:
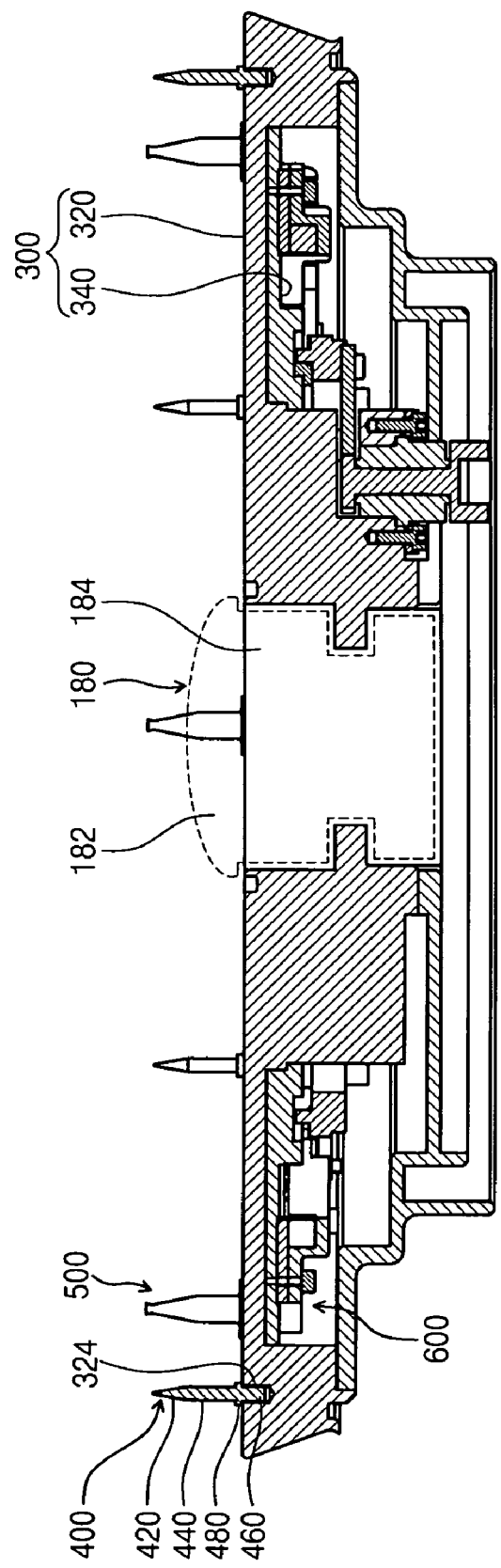
FIG. 5 is a cross-sectional view taken along line I-I of FIG. 4.

As illustrated in FIG. 4 and FIG. 5, the lower nozzle member 100b includes an injecting head 180. The injecting head 180 includes a head part 182 and an insertion part 184. The head part 182 is convex upward and protrudes upward from the spin head 40. The head part 182 is provided with a plurality of discharging holes 120b, 140b, and 160b that inject one of a plurality of types of chemical solution, rinse solution, and dry gas such as isopropyl alcohol vapor or nitrogen gas. The insertion part 184 has a diameter that is constant in the longitudinal direction thereof and smaller than that of the lower end of the head part 182. The insertion part 184 extends downward from the head part 182. The insertion part 184 is inserted into a through hole disposed in the center of the spin head 40.

The spin head 40 rotates to spread chemical solution, rinse solution, and dry gas supplied from the upper nozzle member 100a and the lower nozzle member 100b from the center of the upper or lower surface of the substrate W to the edge thereof, thus cleaning the substrate W.

Figure 2:
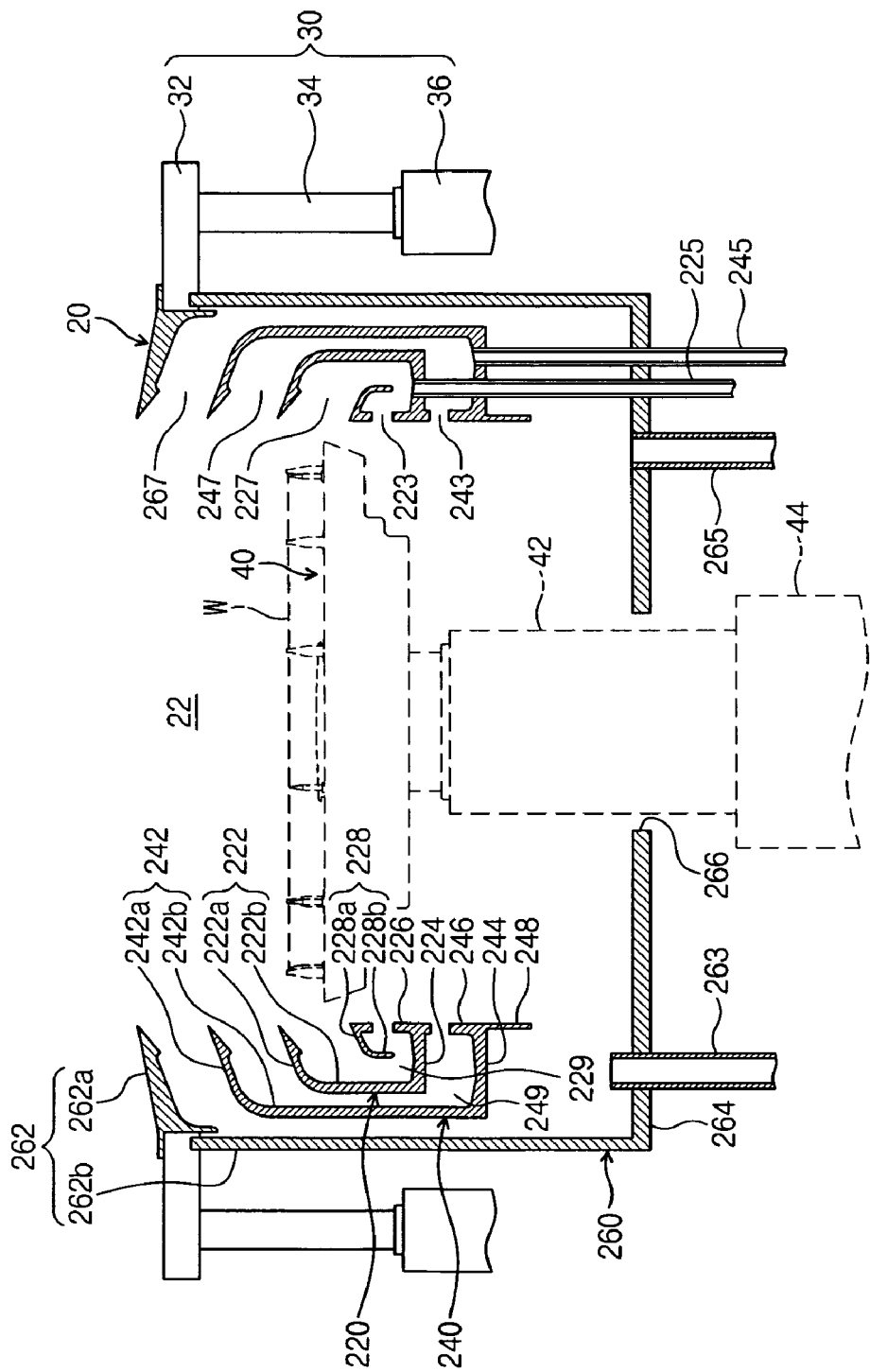
FIG. 2 is a cross-sectional view illustrating a container according to an embodiment of the present invention.
Figure 3:
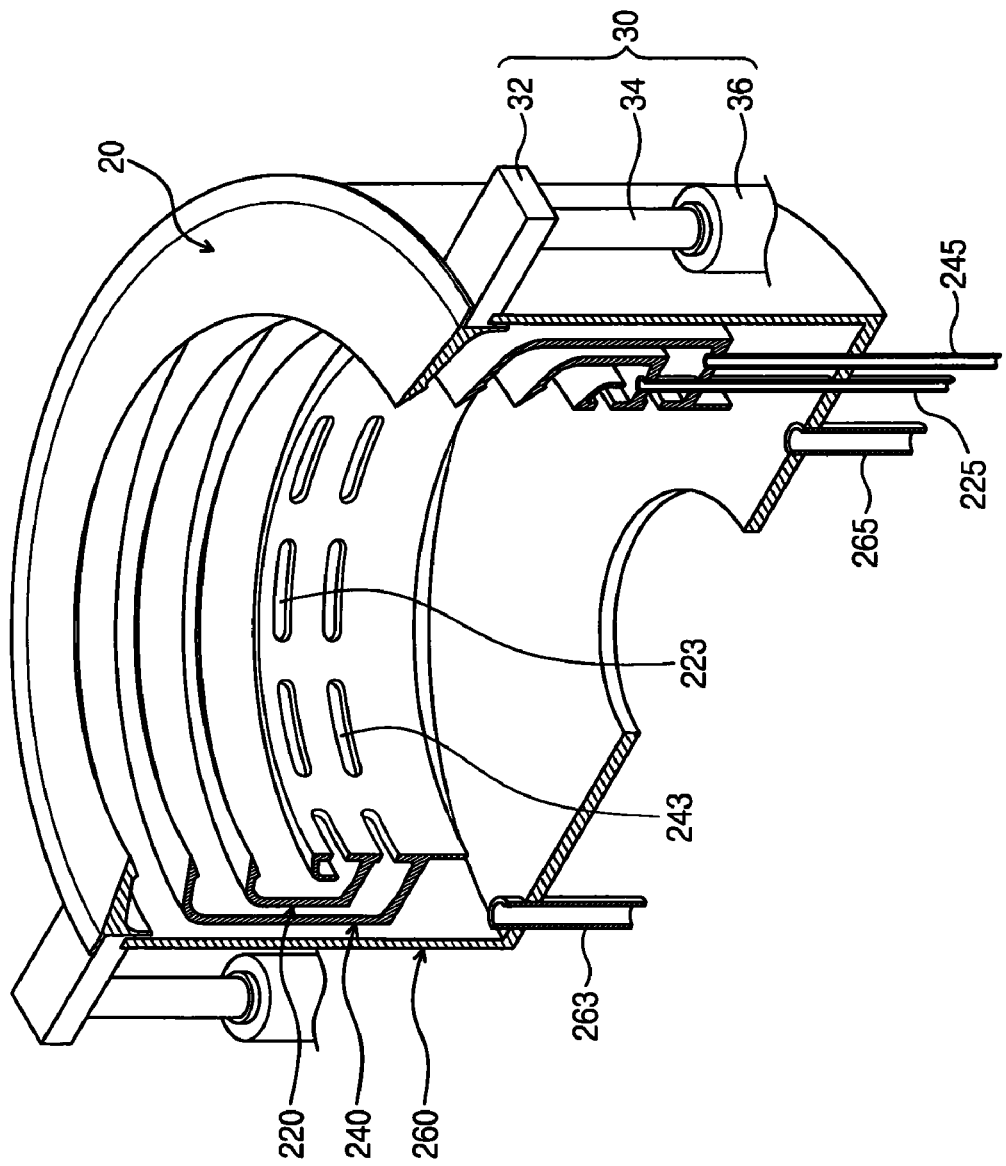
FIG. 3 is a vertical cut-away perspective view illustrating the container of FIG. 2.

FIG. 2 is a cross-sectional view illustrating the container 20. FIG. 3 is a vertical cut-away perspective view illustrating the container 20. Referring to FIGS. 2 and 3, the container 20 has an open upper portion and an inner space 22 in which the substrate W is processed. The spin head 40 is disposed in the inner space 22. A rotation shaft 42 supporting and rotating the spin head 40 is fixed to the lower surface of the spin head 40, and protrudes out of the container 20 through an opening in the bottom of the container 20. A driver 44 such as a motor is fixed to the rotation shaft 42 to supply torque to the rotation shaft 42.

The container 20 is configured to separate and collect process solutions used in a process, thus reusing the process solutions. The container 20 includes a plurality of collecting vessels 220, 240, and 260 that collect different types of process solution used in the process, respectively. The collecting vessels 220, 240, and 260, described according to the current embodiment, may be referred to as an inner collecting vessel, a middle collecting vessel, and an outer collecting vessel, respectively.

The inner collecting vessel 220 has a ring shape surrounding the spin head 40, the middle collecting vessel 240 has a ring shape surrounding the inner collecting vessel 220, and the outer collecting vessel 260 has a ring shape surrounding the middle collecting vessel 240. The inner collecting vessel 220, the middle collecting vessel 240, and the outer collecting vessel 260 respectively have introduction openings 227, 247, and 267 that communicate with the inner space 22 of the container 20. Each of the introduction openings 227, 247, and 267 has a ring shape around the spin head 40. Centrifugal force generated by the rotation of the substrate W introduces process solutions, injected to the substrate W in the process, into the collecting vessels 220, 240, and 260 through the introduction openings 227, 247, and 267. The introduction opening 267 of the outer collecting vessel 260 is disposed on the vertical upper side of the introduction opening 247 of the middle collecting vessel 240, and the introduction opening 247 of the middle collecting vessel 240 is disposed on the vertical upper side of the introduction opening 227 of the inner collecting vessel 220. That is, the introduction opening 227 of the inner collecting vessel 220, the introduction opening 247 of the middle collecting vessel 240, and the introduction opening 267 of the outer collecting vessel 260 have different heights from each other.

The inner collecting vessel 220 includes an outer wall 222, a bottom wall 224, an inner wall 226, and a guide wall 228 that have ring shapes, respectively. The outer wall 222 includes an inclined wall 222a inclined downward in a direction toward outside from the spin head 40, and a vertical wall 222b vertically extending downward from the lower end of the inclined wall 222a. The bottom wall 224 horizontally extends in a direction toward the spin head 40 from the lower end of the vertical wall 222b. An end of the bottom wall 224 and the upper end of the inclined wall 222a are disposed on the same vertical line. The inner wall 26 extends vertically upward from the end of the bottom wall 224. The upper end of the inner wall 226 extends to a position that is spaced a predetermined distance from the upper end of the inclined wall 222a. A vertical space between the inner wall 226 and the inclined wall 222a functions as the introduction opening 227 of the inner collecting vessel 220.

The inner wall 226 is provided with a plurality of openings 223 arrayed in a ring shape. Each of the openings 223 has a slit shape. The openings 223 function as exhausting holes that discharge gases, introduced into the inner collecting vessel 220, to the outside through the lower space in the spin head 40. A discharging pipe 225 is connected to the bottom wall 224. Process solution introduced into the inner collecting vessel 220 is discharged through a discharging pipe 225 to an external system for recycling the process solution.

The guide wall 228 includes an inclined wall 228a inclined downward from the upper end of the inner wall 226 in the direction toward outside from the spin head 40, and a vertical wall 228b vertically extending downward from the lower end of the inclined wall 228a. The lower end of the vertical wall 228b is spaced a predetermined distance from the bottom wall 224. The guide wall 228 guides process solution, introduced through the introduction opening 227, to a space 229 defined by the outer wall 222, the bottom wall 224, and the inner wall 226, so that the process solution efficiently flows to the space 229.

The middle collecting vessel 240 is larger than the inner collecting vessel 220 such that the middle collecting vessel 240 surrounds the inner collecting vessel 220. The middle collecting vessel 240 includes an outer wall 242, a bottom wall 244, an inner wall 246, and a protruding wall 248. The outer wall 242, the bottom wall 244, and the inner wall 246 of the middle collecting vessel 240 are approximately similar to the outer wall 222, the bottom wall 224, and the inner wall 226 of the inner collecting vessel 220. A vertical space is disposed between the upper end of an inclined wall 242a constituting the outer wall 242 of the middle collecting vessel 240 and the upper end of the inclined wall 222a constituting the outer wall 222 of the inner collecting vessel 220. The vertical space functions as the introduction opening 247 of the middle collecting vessel 240. The protruding wall 248 vertically extends downward from the end of the bottom wall 244. The upper end of the inner wall 246 of the middle collecting vessel 240 is in contact with the end of the bottom wall 224 of the inner collecting vessel 220. Slit-shaped exhausting holes 243 for discharging gas are arrayed in a ring shape in the inner wall 246 of the middle collecting vessel 240. A discharging pipe 245 is connected to the bottom wall 244. Process solution introduced into the middle collecting vessel 240 is discharged through the discharging pipe 245 to the external system for recycling the process solution.

The outer collecting vessel 260 is larger than the middle collecting vessel 240 such that the outer collecting vessel 260 surrounds the middle collecting vessel 240. The outer collecting vessel 260 includes an outer wall 262 and a bottom wall 264. The outer wall 262 of the outer collecting vessel 260 is similar in shape to the outer wall 242 of the middle collecting vessel 240. A vertical space is disposed between the upper end of an inclined wall 262a constituting the outer wall 262 of the outer collecting vessel 260 and the upper end of the inclined wall 242a constituting the outer wall 242 of the middle collecting vessel 240. The vertical space functions as the introduction opening 267 of the outer collecting vessel 260. The bottom wall 264 has an approximate circular plate shape, and the opening 266 to which the rotation shaft 42 is inserted is disposed in the center of the bottom wall 264. A discharging pipe 265 is connected to the bottom wall 264. Process solution introduced into the outer collecting vessel 260 is discharged through the discharging pipe 265 to the external system for recycling the process solution. The outer collecting vessel 260 functions as the outer wall of the container 20. An exhausting pipe 263 is connected to the bottom wall 264 of the outer collecting vessel 260. Gas introduced into the outer collecting vessel 260 is exhausted through the exhausting pipe 263 to the outside. Gas, discharged through the openings 223 provided to the inner wall 226 of the inner collecting vessel 220 and the exhausting holes 243 provided to the inner wall 246 of the middle collecting vessel 240, is exhausted to the outside through the exhausting pipe 263 connected to the outer collecting vessel 260. The exhausting pipe 263 protrudes with a predetermined length upward from the bottom wall 264.

The elevating unit 30 moves the container 20 up and down along a straight line. As the container 20 moves up and down, the relative height of the container 20 to the spin head 40 is varied. The elevating unit 30 includes a bracket 32, a moving shaft 34, and a driver 36. The bracket 32 is fixed to the outer wall of the container 20, and the moving shaft 34 moved up and down by the driver 36 is fixed to the bracket 32. The container 20 is moved downward to expose the spin head 40 upward out of the container 20 when the substrate W is loaded on the spin head 40 or unloaded from the spin head 40. When the process is performed, the height of the container 20 is adjusted according to the type of process solution supplied to the substrate W, so as to introduce the process solution to a preset one of the collecting vessels 220, 240, and 260. On the contrary, the elevating unit 30 may be provided to move the spin head 40 up and down.

Figure 6:
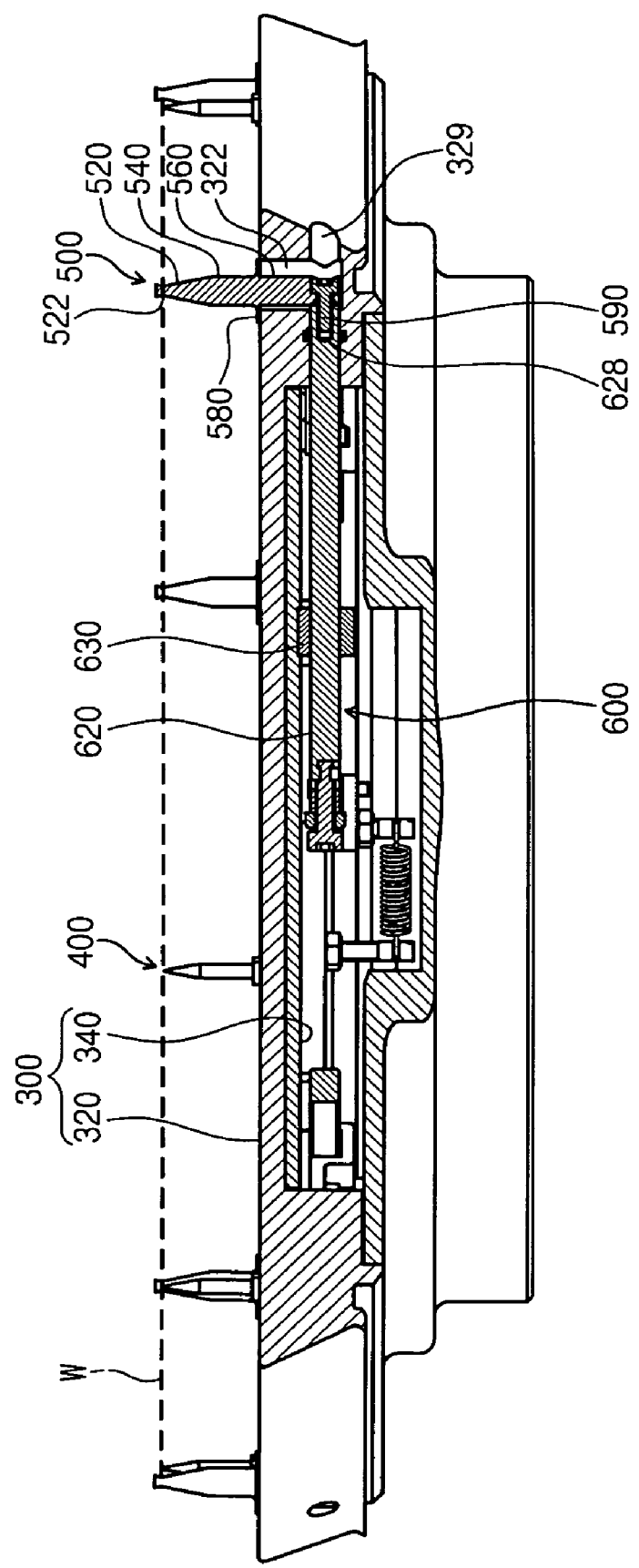
FIG. 6 is a cross-sectional view taken along line II-II of FIG. 4.

Hereinafter, the structure of the spin head 40 will now be described with reference to FIGS. 4 through 6. FIG. 4 is a plan view illustrating the spin head 40. FIG. 5 is a cross-sectional view taken along line I-I of FIG. 4. FIG. 6 is a cross-sectional view taken along line II-II of FIG. 4. The spin head 40 includes a support plate 300, support pins 400, chuck pins 500, and a chuck pin moving unit 600.

The support pins 400 support the lower surface edge of the substrate W to space the substrate W a predetermined distance from the upper surface of the support plate 300. All of the support pins 400 have an identical shape and an identical size. The support pin 400 includes an upper portion 420 gradually increasing in diameter downward, and a lower portion 440 extending downward from the upper portion 420 and having a constant diameter. A thread portion 460 having an outer surface with a thread is disposed under the lower portion 440. A stop portion 480 is disposed between the lower portion 440 and the thread portion 460, and has a diameter larger than those of the lower portion 440 and the thread portion 460. The thread portion 460 is screwed to the support plate 300 and fixed. The lower surface of the stop portion 480 is in close contact with the upper surface of the support plate 300. The stop portions 480 limit lengths along which the support pins 400 are inserted into the support plates 300, so that the support pins 400 have an identical height.

The chuck pins 500 protrude upward from the upper surface of the support plate 300 at the edge of the support plate 300. The number of the chuck pins 500 may be six. The chuck pins 500 support the lateral portion of the substrate W to prevent the substrate W from laterally moving out of a desired position when the spin head 40 rotates. All of the chuck pins 500 have an identical shape and an identical size. The chuck pin 500 includes a support portion 520, a middle portion 540, a coupling portion 560, and a stop portion 580. The support portion 520 gradually decreases in diameter downward from its flat upper surface, and then gradually increases in diameter. Thus, the support portion 520 has a concave portion 522 that is recessed inward at a front view. The concave portion 522 is in contact with the lateral portion of the substrate W placed on the support pins 400. The middle portion 540 extends downward from the lower end of the support portion 520, and has the diameter of the lower end of the support portion 520. The coupling portion 560 extends downward from the support portion 520. The coupling portion 560 is provided with a thread hole for coupling to the chuck pin moving unit 600. The stop portion 580 extends outward from the middle portion 540, and has a ring shape. The stop portion 580 is in close contact with the upper surface of the support plate 300, and makes the chuck pins 500 protrude with an identical height.

The support plate 300 includes an upper plate 320 and a lower plate 340. The upper plate 320 has an upper surface having an approximately circular shape at a top view. The lower plate 340 is disposed under the upper plate 320, and provides a space accommodating the chuck pin moving unit 600. The upper plate 320 is provided with thread holes 324 to which the support pins 400 are fixed. The edge of the upper plate 320 is provided with pin holes 322 to which the chuck pins 500 are inserted.

Each of the pin holes 322 has a slit shape. The longitudinal direction of the pin holes 322 is perpendicular to the radial direction of the upper plate 320. The pin hole 322 has a width equal to or slightly greater than the diameter of the middle portion 540 of the chuck pin 500, and a length to guide the moving of the chuck pins 500. The length of the pin hole 322 may be less than the diameter of the stop portion 580 of the chuck pins 500. Alternatively, the pin hole 322 may have a circular shape. In this case, the diameter of the pin hole 322 may be greater than that of the middle portion 540 of the chuck pin 500, and less than that of the stop portion 580. The centers of the upper plate 320 and the lower plate 340 are provided with through holes to which the injecting head 180 is inserted.

The chuck pin moving unit 600 moves the chuck pins 500 between supporting positions and waiting positions. The supporting positions are positions where the chuck pins 500 are in contact with the lateral portion of the substrate W during the process. The waiting positions are positions where the chuck pins 500 provide a space greater than the substrate W to place the substrate W on the spin head 40. Thus, the supporting position is closer to the center of the support plate 300 than the waiting position.

Figure 7:
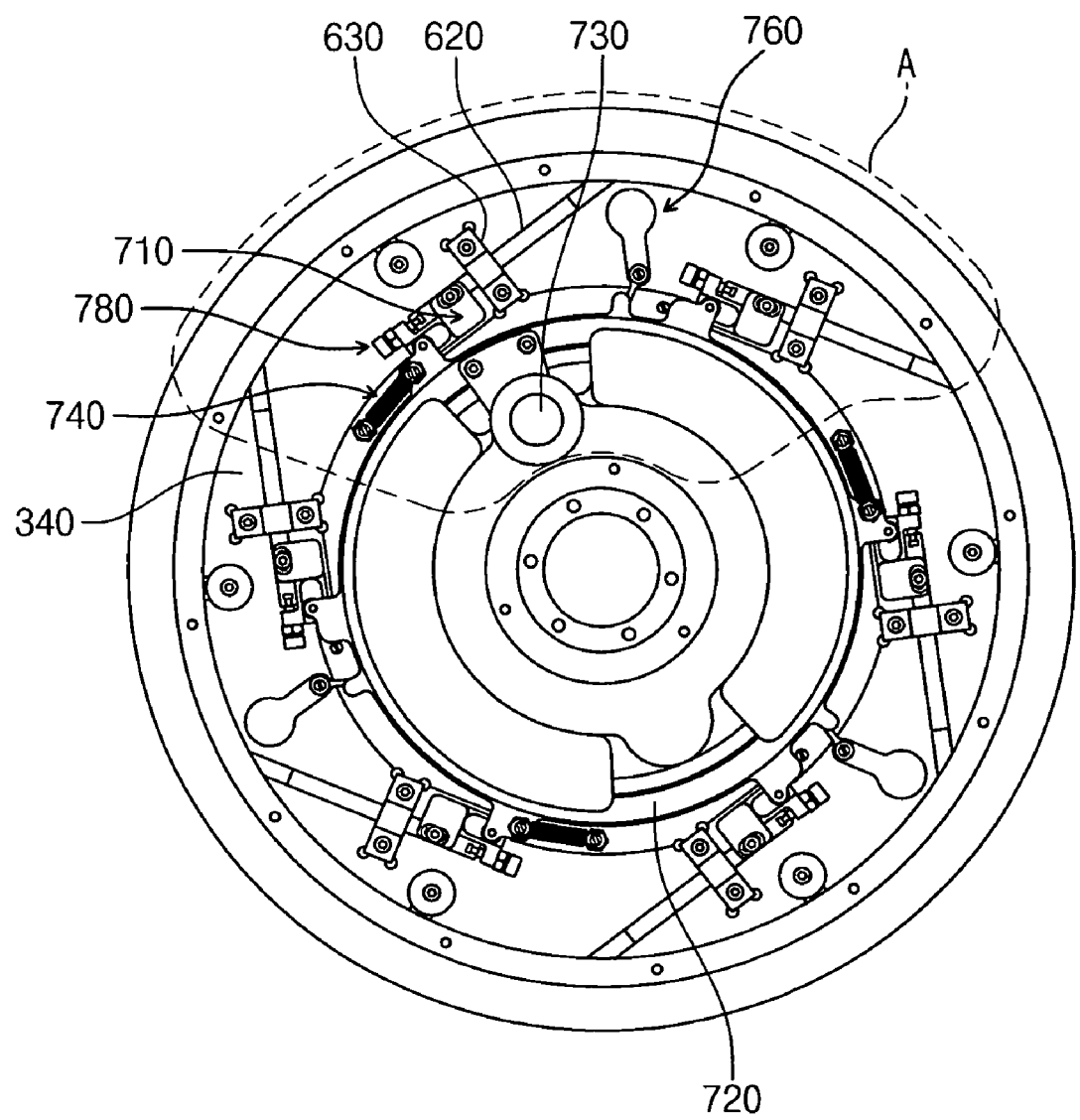
FIG. 7 is a bottom view illustrating a chuck pin moving unit and the inner structure of a lower plate.
Figure 8:
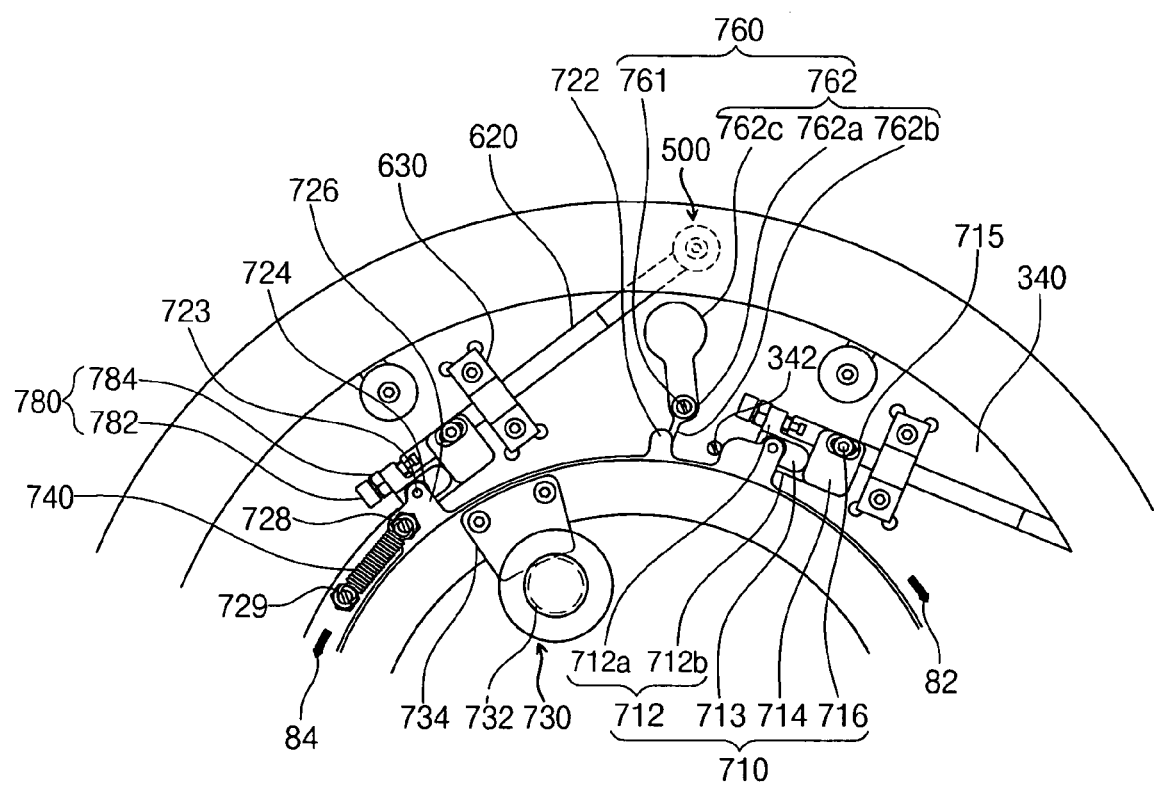
FIG. 8 is an enlarged view illustrating a portion 'A' of FIG. 7.

FIG. 7 is a bottom view illustrating the chuck pin moving unit 600 and the inner structure of the lower plate 340. FIG. 8 is an enlarged view illustrating a portion 'A' of FIG. 7. Referring to FIGS. 6 through 8, the chuck pin moving unit 600 includes moving rods 620, guide members 630, and a driving member.

The number of the moving rods 620 is equal to the number of the chuck pins 500. Each of the chuck pins 500 is coupled to each of the moving rods 620. The moving rods 620 are disposed in the lower plate 340 in the directions perpendicular to the radial direction of the support plate 300. As illustrated in FIG. 6, the upper plate 320 has a lateral portion that protrudes downward from the edge of the upper plate 320. The lateral portion of the upper plate 320 is provided with holes 329 passing through regions from the outside to the inside. The hole 329 communicates with the pin hole 322 disposed in the upper plate 320. The outer end of the moving rod 620 is disposed in the hole 329 and provided with a thread hole 628. The lower end of the coupling portion 560 of the chuck pin 500 and the outer end of the moving rod 620 are fixed to each other through a screw 590.

The guide members 630 are disposed in moving paths respectively of the moving rods 620 to guide the moving rods 620 in the perpendicular directions to the radial direction of the support plate 300. Sliding bearings may be used as the guide members 630, which are fixed to the support plate 300.

The driving member moves the moving rods 620 in the perpendicular directions to the radial direction of the support plate 300, so that the chuck pins 500 move between the waiting positions and the supporting positions. The driving member includes guides 710, a rotation plate 720, a rotation plate driver 730, and restorers 740.

The guide 710 is coupled to a second end of the moving rod 620 such that the guide 710 is disposed on the opposite side of the moving rod 620 to the chuck pin 500. The guide 710 includes a first body 712 and a second body 714. The first body 712 may have a '┐' shape, which may face an end surface of the moving rod 620 and a lateral surface of the moving rod 620. A first portion 712a facing the end surface of the moving rod 620 is screw-coupled to a transporting shaft 782 of the distance adjusting member 780 that will be described later. A second portion 712b facing the lateral surface of the moving rod 620 is provided with a guide hole 713 having a slot shape disposed along the longitudinal direction of the moving rod 620. The second body 714 is coupled to an end of the second portion 712b of the first body 712, so as to provide the guide 710 having a '⊏' shape. The second body 714 is provided with a hole 715. The second body 714 is removably coupled to the moving rod 620 through a screw 716 inserted into the hole 715. Coupling surfaces of the moving rod 620 and the second body 714 facing each other may include surfaces that do not rotate relative to each other. That is, coupling surfaces of the moving rod 620 and the second body 714 facing each other may include planes.

The rotation plate 720 has an approximate ring shape, and includes first protrusions 722 and second protrusions 726 that protrude outward from the outer circumferential surface of the rotation plate 720. The first protrusions 722 will be described later. The number of the second protrusions 726 is equal to the number of the moving rods 620. The second protrusions 726 are disposed at positions respectively corresponding to the moving rods 620. A driving rod 723 is installed along a perpendicular direction to a plane of the second protrusion 726. A roller 724 is rotatably coupled to the driving rod 723. The roller 724 is inserted into the guide hole 713 of the guide 710, and may be in contact with the inner surface of the guide hole 713. The roller 724 may include a metal bearing.

When the chuck pin 500 moves between the supporting position and the waiting position, the roller 724 contacting an end of the guide hole 713 moves along the guide hole 713, and then contacts the other end of the guide hole 713. That is, the chuck pin 500 does not move while the roller 724 moves between both the ends of the guide hole 713, but the chuck pin 500 moves when the roller 724 contacts one end of the guide hole 713 and applies contact load to the guide hole 713. To this end, the length of the slot-shaped guide hole 713 may be greater than the outer diameter of the roller 724.

The rotation plate driver 730 rotates the rotation plate 720 in a first rotation direction 82, and the restorer 740 rotates the rotation plate 720 in a second rotation direction 84 that is opposite to the first rotation direction 82. A rotary cylinder (not shown) may be used as the rotation plate driver 730 to rotate the rotation plate 720 through a predetermined angle. A rotation shaft (not shown) of the rotary cylinder is coupled with a first gear member 732 having a circumference surface with teeth, and the first gear member 732 is engaged with a second gear member 734 provided with an internal gear. The second gear member 734 is fixed to the rotation plate 720.

The restorer 740 restores the rotation plate 720, rotated by the rotation plate driver 730, to an initial position. An elastic member providing elastic force as restoring force, e.g. a spring may be used as the restorer 740. The rotation plate 720 is provided with first latches 728 to which first ends of springs are fixed, and the lower plate 340 of the support plate 300 is provided with second latches 729 to which second ends of the springs are fixed.

The first latch 728 may be provided to one of the neighboring second protrusions 726. The second latch 729 may be provided to a region of the lower plate 340 corresponding to the first latch 728. The number of the restorers 740 may correspond to the number of the first latch 728 or the second latch 729.

The support plate 300 is provided with stoppers 342. The stoppers 342 limit rotation ranges of the second protrusions 726 provided to the rotation plate 720 when the restorers 740 restore the rotation plate 720. The number of the stoppers 342 may correspond to the number of the second protrusions 726. Alternatively, the number of the stoppers 342 may correspond to the number of the second protrusions 726 that are not connected to the restorer 740.

Figure 9A:
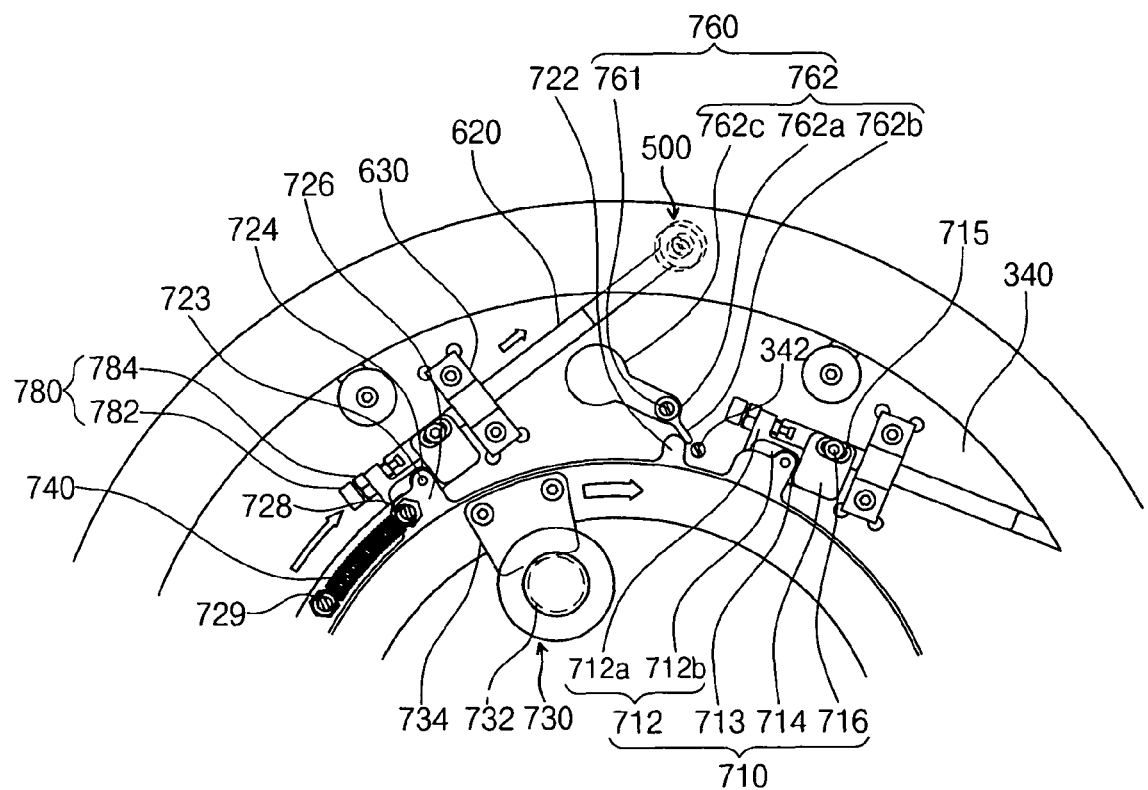
FIGS. 9A and 9B are schematic views illustrating force applied to components of a chuck pin moving unit and moving directions of the components of the chuck pin moving unit when chuck pins move between waiting positions and supporting positions, according to an embodiment of the present invention.
Figure 9B:
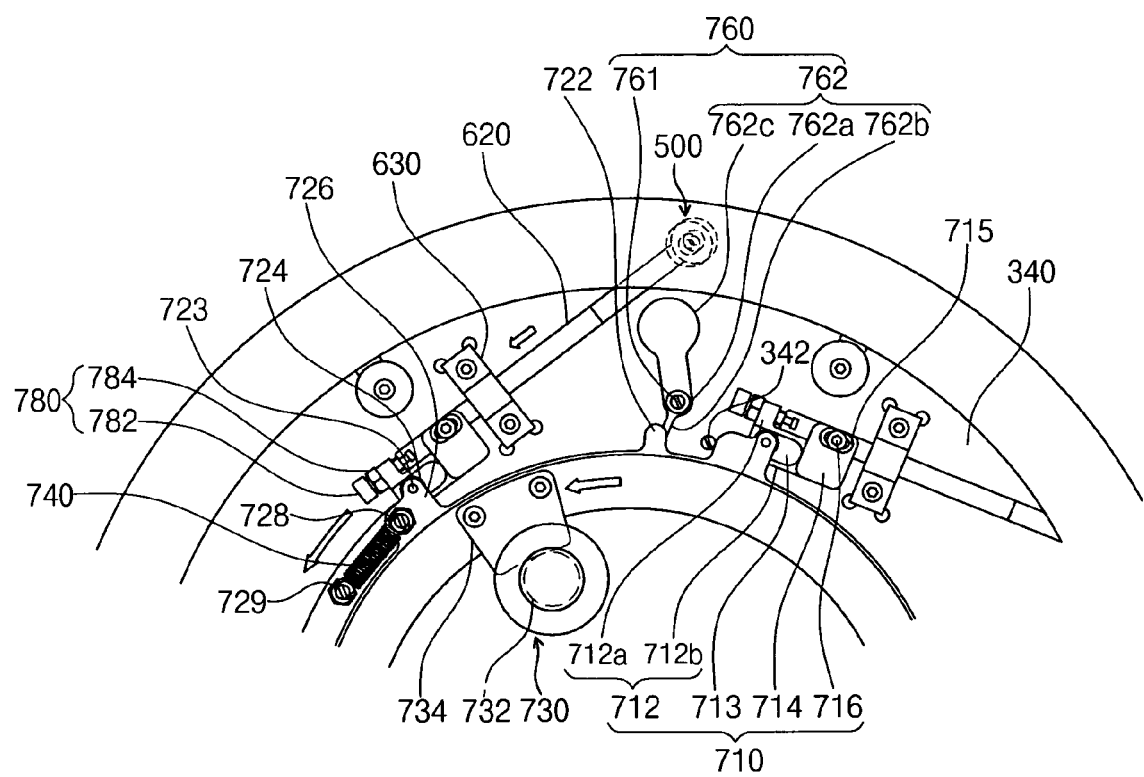

FIGS. 9A and 9B are schematic views illustrating force applied to the components of the chuck pin moving unit 600 and moving directions of the components of the chuck pin moving unit 600 when the chuck pins 500 move between the waiting positions and the supporting positions.

Referring to FIG. 9A, when the rotation plate driver 730 rotates the rotation plate 720 in the first rotation direction 82, the roller 724 moves along the guide hole 713 to push the guide 710 in the longitudinal direction of the moving rod 620. Then, the moving rod 620 coupled to the guide 710 moves in a straight line to move the chuck pin 500 from the supporting position to the waiting portion. At this point, the spring of the restorer 740 is extended. Thereafter, referring to FIG. 9B, when the driving force is removed from the rotation plate driver 730, the elastic force of the restorer 740 rotates the rotation plate 720 in the second rotation direction 84, and the roller 724 reversely moves to push the guide 710. Then, the moving rod 620 coupled to the guide 710 moves to shift the chuck pin 500 from the waiting portion to the supporting position. According to the current embodiment, when the chuck pin 500 is disposed at the supporting position, the spring is in equilibrium. Thus, the chuck pin 500 stably supports the substrate W even when the rotation plate driver 730 fails to work in the process.

When the spin head 40 rotates at a high speed, centrifugal force may move the chuck pins 500 to the outside of the support plate 300. Accordingly, the chuck pins 500 unstably support the substrate W during the process. The contact maintaining member 760 continually brings the chuck pin 500 in contact with the lateral portion of the substrate W at the supporting position when the spin head 40 rotates.

The contact maintaining member 760 includes the first protrusion 722 protruding from the rotation plate 720, and a maintaining bar 762. The first protrusion 722 is disposed at a position of the rotation plate 720 corresponding to the maintaining bar 762. The maintaining bar 762 pushes the first protrusion 722 in the second rotation direction 84 so as to prevent the chuck pin 500 from moving to the waiting position by reverse centrifugal force when the spin head 40 rotates. The stoppers 342 limit rotation ranges of the first protrusions 722.

For example, the maintaining bar 762 has a shape to push the first protrusion 722 using reverse centrifugal force generated by the rotation of the spin head 40. Referring again to FIG. 8, the maintaining bar 762 includes a middle portion 762a, a pressing portion 762b, and a guide portion 762c. The middle portion 762a is coupled to the support plate 300 through a shaft pin 761, and thus rotatable about the support plate 300. The pressing portion 762b extends in a predetermined direction from the middle portion 762a, and the guide portion 762c extends from the middle portion 762a to form an obtuse angle with the pressing portion 762b. The pressing portion 762b and the guide portion 762c have rod shapes, respectively. The pressing portion 762b pushes the first protrusion 722 in the second rotation direction 84 when the spin head 40 rotates. The guide portion 762c guides the pressing portion 762b to the first protrusion 722 when the spin head 40 rotates.

The guide portion 762c may be heavier than the pressing portion 762b. The width of the guide portion 762c may be greater than that of the pressing portion 762b at a top view. An end of the guide portion 762c may have a thicker portion than the pressing portion 762b.

Figure 10:
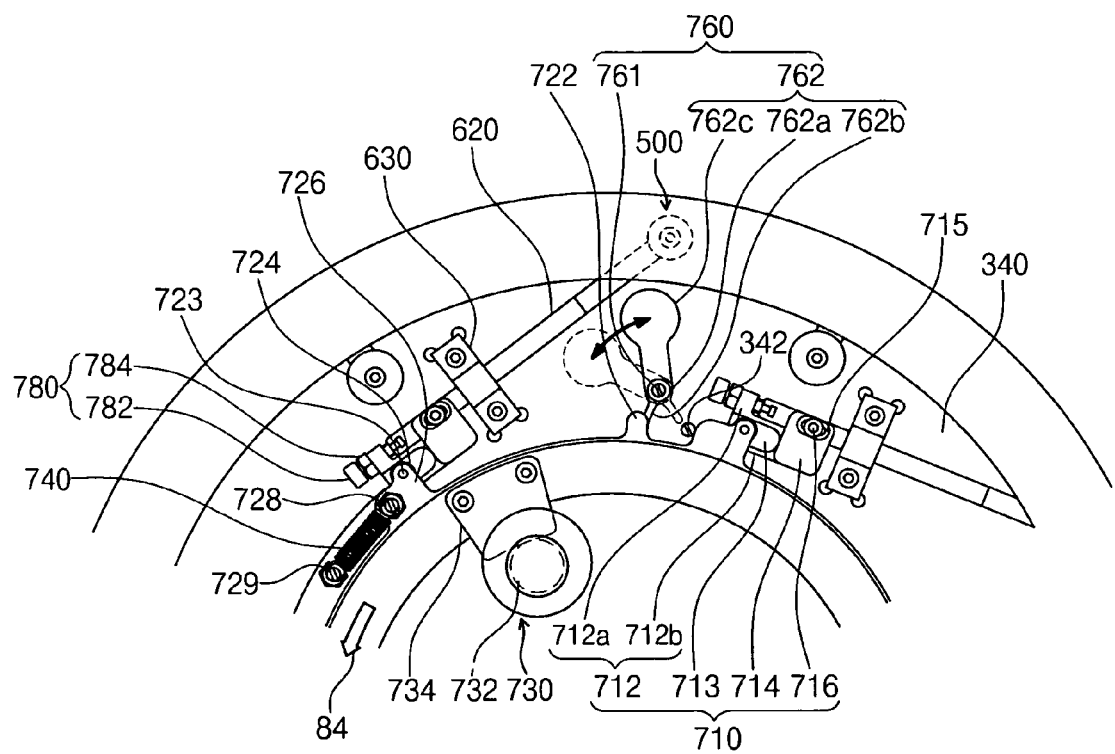
FIG. 10 is a schematic view illustrating a process in which a contact maintaining member uses reverse centrifugal force to bring a chuck pin in contact with a substrate, according to an embodiment of the present invention.

FIG. 10 is a schematic view illustrating a process in which the contact maintaining member 760 uses reverse centrifugal force to bring the chuck pin 500 in contact with the substrate W.

Referring to FIG. 10, while the chuck pin 500 moves to the supporting position, and the spin head 40 rotates, the guide portion 762c is rotated in a opposite direction to the second rotation direction 84 by reverse centrifugal force. Since the pressing portion 762b is fixed to the guide portion 762c, the pressing portion 762b is rotated with the guide portion 762c. That is, the pressing portion 762b is rotated to the first protrusion 722 by reverse centrifugal force, so as to push the first protrusion 722 in the second rotation direction 84. Thus, while the spin head 40 rotates, the chuck pin 500 is continually in contact with the lateral portion of the substrate W.

As described above, since the contact maintaining member 760 uses reverse centrifugal force due to the rotation of the spin head 40 to push the first protrusion 722, an additional driver for rotating the contact maintaining member 760 is unnecessary, and the structure thereof is simplified. Alternatively, the contact maintaining member 760 may include an additional driver to push the first protrusion 722 in the second rotation direction 84.

The diameter of the substrate W may be varied according to the type of a previous process performed on the substrate W. For example, when a heat treating process is performed on the substrate W as a previous process, the substrate W is expanded to vary the diameter. At this point, the distance adjusting members 780 may adjust positions of the chuck pins 500 for supporting the substrate W, with response to the variation of the diameter of the substrate W.

Referring again to FIG. 8, the distance adjusting member 780 includes the transporting shaft 782 that is axially aligned with the moving rod 620 along the longitudinal direction of the moving rod 620. An end of the transporting shaft 782 is rotatably coupled to the second end of the moving rod 620. A thread is formed on an outer circumferential surface of the transporting shaft 782. The transporting shaft 782 is screw-coupled to the first body 712 of the guide 710. A fixer 784 is disposed on the opposite side of the transporting shaft 782 to the moving rod 620 with respect to the first body 712, and is screw-coupled to the transporting shaft 782.

Figure 11:
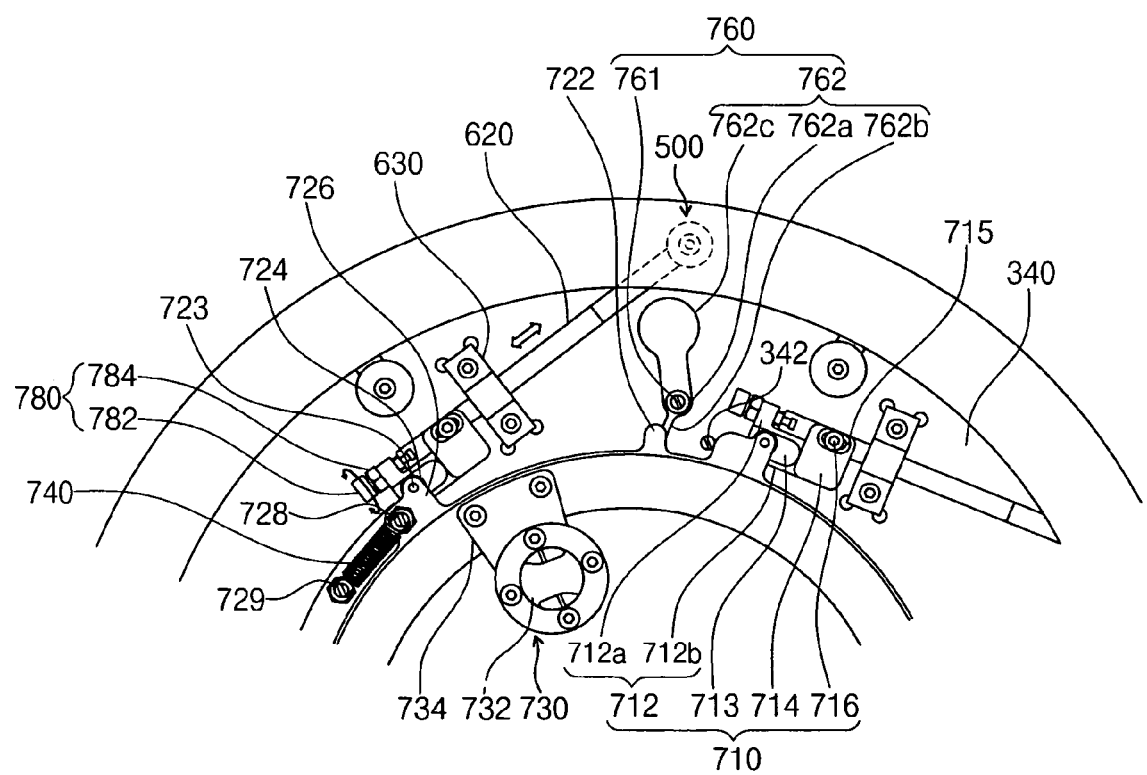
FIG. 11 is a schematic view illustrating the operation of a distance adjusting member, according to an embodiment of the present invention.

FIG. 11 is a schematic view illustrating the operation of the distance adjusting member 780. Referring to FIG. 11, when the transporting shaft 782 is rotated clockwise, the moving rod 620 and the chuck pin 500 are moved in a straight line in a direction toward outside of the support plate 300. On the contrary, when the transporting shaft 782 is rotated counter-clockwise, the moving rod 620 and the chuck pin 500 are moved in a straight line in the opposite direction. Accordingly, the positions of the chuck pins 500 for supporting the substrate W can be adjusted.

FIGS. 12A through 12E are schematic views illustrating a process in which the distance adjusting member 780 varies the supporting position of the chuck pin 500. Hereinafter, the process in which the distance adjusting member 780 varies the supporting position of the chuck pin 500 will now be described with reference to FIGS. 12A through 12E.

Figure 12A:
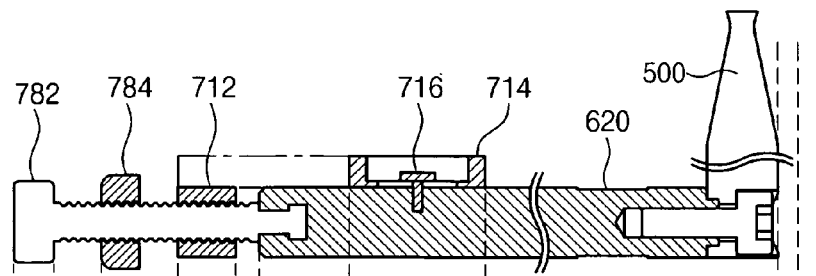
FIGS. 12A through 12E are schematic views illustrating a process in which a distance adjusting member varies a supporting position of a chuck pin.

Referring to FIG. 12A, the fixer 784 is spaced apart from the first body 712 on the transporting shaft 782. Since the fixer 784 is screw-coupled to the transporting shaft 782, the fixer 784 may be spaced apart from the first body 712 by rotating the fixer 784. Then, the screw 716 coupling the second body 714 of the guide 710 to the moving rod 620 is unscrewed.

Figure 12B:
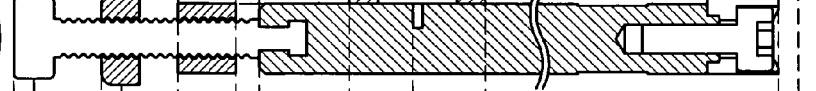

Referring to FIG. 12B, the transporting shaft 782 is rotated clockwise. The clockwise direction is a rotation direction according to the right-hand grip rule when a screw moves from the transporting shaft 782 to the moving rod 620.

Figure 12C:
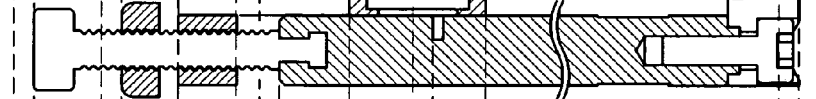

Referring to FIG. 12C, when the transporting shaft 782 rotates, the transporting shaft 782, the moving rod 620, and the chuck pin 500 move in a direction toward the moving rod 620 from the transporting shaft 782. Because the first body 712 of the guide 710 is screw-coupled to the transporting shaft 782, and the rotation of the first body 712 is confined, the transporting shaft 782 is axially moved when the transporting shaft 782 is rotated.

Figure 12D:

After the chuck pin 500 moves to vary the supporting position thereof, referring to FIG. 12D, the screw 716 is screwed to fix the second body 714 of the guide 710 to the moving rod 620.

Figure 12E:

Referring to FIG. 12E, the fixer 784 is rotated to be in surface-contact with the first body 712 of the guide 710, thus preventing the moving of the first body 712.

According to the embodiment of the present invention, the effect of centrifugal force applied to the chuck pins during the rotation of the support plate is minimized to support a substrate more stably.

According to the embodiment of the present invention, when the chuck pins support the lateral portion of a substrate, all of the chuck pins are in contact with the lateral portion. Thus, the position of the substrate is stable, force is prevented from being concentrated to a part of the chuck pins.

According to the embodiment of the present invention, even when a substrate rotates at a high speed, the chuck pins are maintained at contact positions with the lateral portion of the substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A spin head comprising:
a support plate;
chuck pins installed at the support plate to support a lateral surface of a substrate; and
a chuck pin moving unit configured to move the chuck pins along a second direction different from a first direction toward periphery from a center of the support plate,
wherein the chuck pin moving unit includes,
moving rods disposed to have a lengthwise direction along the second direction, first ends of the moving rods being coupled with the chuck pins, and
a driving member moving the moving rods in a straight line along the second direction to move the chuck pins between supporting positions and waiting positions.

2. The spin head of claim 1, wherein the support plate has a circular shape, the first direction is a radial direction of the support plate, and the second direction is perpendicular to the first direction.

3. The spin head of claim 1, wherein the driving member comprises:
guides coupled to second ends respectively of the moving rods and having guide holes; and
a rotatable rotation plate having a ring shape and provided with driving rods inserted into the guide holes of the guides.

4. The spin head of claim 3, wherein the driving member further comprises a restorer,
wherein the restorer returns the rotation plate rotated to an initial position when the rotation plate is rotated such that the driving rods apply contact load to the guide holes to move the chuck pins to the waiting positions, and
the restorer includes an elastic member that has a first end coupled to the rotation plate and a second end coupled to the support plate to generate restoring force through elasticity.

5. The spin head of claim 4, wherein the rotation plate is provided with a first latch to which the first end of the elastic member is fixed,
the support plate is provided with a second latch to which the second end of the elastic member is fixed,
the second latch is spaced apart from the first latch along a circumferential direction of the support plate, and
the elastic member is maintained in extended state when the chuck pins are disposed at the waiting positions.

6. The spin head of claim 3, wherein the driving member further comprises a roller rotatably coupled to the driving rod and contacting an inner surface of the guide hole.

7. The spin head of claim 6, wherein the guide hole has a slot shape with a length greater than an outer diameter of the roller such that the roller contacting a first end of the guide hole moves along the guide hole, and then, contacts a second end of the guide hole when the chuck pin moves between the supporting position and the waiting position.

8. The spin head of claim 3, wherein the rotation plate is provided with a plurality of protrusions protruding from a circumferential surface of the rotation plate along a radial direction, the number of the protrusions corresponds to the number of the driving rods, and the driving rods are installed at the protrusions, respectively.

9. The spin head of claim 8, wherein the driving member further comprises a restorer, wherein the restorer returns the rotation plate rotated to an initial position when the rotation plate is rotated such that the driving rods apply contact load to the guide holes to move the chuck pins to the waiting positions, the restorer includes an elastic member that has a first end coupled to the protrusion and a second end coupled to the support plate to generate restoring force through elasticity, the protrusion is provided with a first latch to which the first end of the elastic member is fixed, the support plate is provided with a second latch to which the second end of the elastic member is fixed, the second latch is spaced apart from the first latch along a circumferential direction of the support plate, and the elastic members are maintained in extended state when the chuck pins are disposed at the waiting positions.

10. The spin head of claim 9, wherein the driving member further comprises stoppers that are provided to the support plate to limit rotation ranges of the protrusions provided to the rotation plate when the rotation plate is restored by the elastic members.

11. The spin head of claim 10, wherein the first end of each of the elastic members is coupled to one of neighboring ones of the protrusions, and the stoppers are provided to the support plate to limit the rotation ranges of the protrusions not coupled with the elastic member.

12. The spin head of claim 3, wherein the chuck pin moving unit further comprises contact maintaining members, wherein the contact maintaining member rotates the rotation plate to maintain contact of the driving rod with the guide hole while the chuck pin is disposed at the supporting position, and the contact maintaining member is movable to a position allowing rotation of the rotation plate while the chuck pin moves from the supporting position to the waiting position.

13. The spin head of claim 12, wherein the contact maintaining member has a shape configured to rotate the rotation plate by reverse centrifugal force when the support plate is rotated.

14. The spin head of claim 13, wherein the contact maintaining member comprises:

a first protrusion protruding from a circumferential surface of the rotation plate; and a maintaining bar installed at the support plate and rotated by the reverse centrifugal force to contact the first protrusion, wherein the maintaining bar includes:

a middle portion coupled to the support plate to be rotatable about the support plate;

a pressing portion extending from the middle portion to the rotation plate and pushing the first protrusion; and a guide portion extending in a direction toward periphery of the support plate from the middle portion.

15. The spin head of claim 14, wherein the guide portion is heavier than the pressing portion.

16. The spin head of claim 15, wherein an angle between the guide portion and the pressing portion is an obtuse angle.

17. The spin head of claim 14, wherein the rotation plate is provided with a plurality of second protrusions that protrude along a radial direction of the rotation plate, the number of the second protrusions corresponds to the number of the driving rods, the driving rods are respectively installed at the second protrusions, and the driving member further comprises stoppers provided to the support plate to limit rotation ranges of the first protrusions and the second protrusions.

18. The spin head of claim 3, wherein the chuck pin moving unit further comprises a distance adjusting member adjusting the supporting positions of the chuck pins, the distance adjusting member comprises a transporting shaft that is axially aligned with the moving rod along the longitudinal direction of the moving rod, the transporting shaft has an end rotatably coupled to the second end of the moving rod, and a circumferential surface provided with a thread, and the guide comprises:

a first body screw-coupled to the transporting shaft; and a second body connected to the first body and removably coupled to the moving rod to prevent the first body from rotating relative to the moving rod.

19. The spin head of claim 18, wherein the distance adjusting member further comprises a fixer disposed on an opposite side of the transporting shaft to the moving rod with respect to the first body and screw-coupled to the transporting shaft.

20. The spin head of claim 1, wherein the chuck pin moving unit further comprises a guide member installed at the support plate and guiding the moving rod moving along the second direction.

* * * * *